(12) United States Patent
Zabek et al.

(10) Patent No.: US 10,811,586 B2
(45) Date of Patent: Oct. 20, 2020

(54) APPARATUS AND METHOD FOR GENERATING ELECTRICAL ENERGY

(71) Applicant: University of Bath, Bath (GB)

(72) Inventors: Daniel Zabek, Bath (GB); Christopher R. Bowen, Bath (GB); Vincent Ayel, Chassenuil-du-Poitou (FR); Yves Bertin, Chassenuil-du-Poitou (FR); Cyril Romestant, Paris (FR)

(73) Assignee: University of Bath, Bath (GB)

( * ) Notice: Subject to any disclaimer, the term of this patent is extended or adjusted under 35 U.S.C. 154(b) by 68 days.

(21) Appl. No.: 16/077,228

(22) PCT Filed: Feb. 10, 2017

(86) PCT No.: PCT/GB2017/050342
§ 371 (c)(1),
(2) Date: Aug. 10, 2018

(87) PCT Pub. No.: WO2017/137760
PCT Pub. Date: Aug. 17, 2017

(65) Prior Publication Data
US 2019/0051809 A1 Feb. 14, 2019

(30) Foreign Application Priority Data

Feb. 12, 2016 (EP) .................................. 16305165
Feb. 26, 2016 (GB) .................................. 1603373.0

(51) Int. Cl.
*H01L 37/02* (2006.01)
*F28D 15/02* (2006.01)
*F28F 13/10* (2006.01)

(52) U.S. Cl.
CPC .............. *H01L 37/02* (2013.01); *F28D 15/02* (2013.01); *F28D 15/0266* (2013.01); *F28F 13/10* (2013.01)

(58) Field of Classification Search
CPC ..... H01L 37/02; F28D 15/02; F28D 15/0266; F28F 13/10
(Continued)

(56) References Cited

U.S. PATENT DOCUMENTS 4,921,041 A   5/1990  Akachi
6,657,358 B2 * 12/2003  Perner .................... H01L 37/02
                                                          290/1 R
(Continued)

FOREIGN PATENT DOCUMENTS

CN        2837741 Y    11/2006
CN      105099277 A    11/2015
(Continued)

OTHER PUBLICATIONS

Jun. 12, 2017—International Search Report and Written Opinon—PCT/GB2017/050342.
(Continued)

*Primary Examiner* — John K Kim
(74) *Attorney, Agent, or Firm* — Banner & Witcoff, Ltd.

(57) ABSTRACT

An apparatus for generating electrical energy comprises an oscillating heat pipe for transferring heat between a heat source and a heat sink, and a pyroelectric generator for generating electricity from thermal fluctuations generated by the oscillating heat pipe as the oscillating heat pipe transfers heat between the heat source and the heat sink.

24 Claims, 10 Drawing Sheets

(58) Field of Classification Search
USPC .......................................................... 310/306
See application file for complete search history.

(56) References Cited

U.S. PATENT DOCUMENTS

| | | | | |
|---|---|---|---|---|
| 8,035,274 | B2* | 10/2011 | Erbil | H01L 37/02 |
| | | | | 136/254 |
| 8,174,245 | B2* | 5/2012 | Carver | H01L 37/00 |
| | | | | 136/201 |
| 2011/0067843 | A1* | 3/2011 | Vasiliev, Jr. | F28D 15/0233 |
| | | | | 165/104.26 |
| 2013/0002091 | A1* | 1/2013 | Kim | H01L 35/30 |
| | | | | 310/306 |
| 2014/0298811 | A1* | 10/2014 | McKay | F03G 7/06 |
| | | | | 60/645 |
| 2015/0001989 | A1* | 1/2015 | Kim | H02N 11/002 |
| | | | | 310/306 |
| 2015/0256108 | A1* | 9/2015 | Kim | H01L 37/02 |
| | | | | 310/306 |
| 2019/0051809 | A1* | 2/2019 | Zabek | F28F 13/10 |

FOREIGN PATENT DOCUMENTS

| | | |
|---|---|---|
| CN | 107747750 B | 3/2019 |
| EP | 2609317 A1 | 7/2013 |
| JP | 2002034233 A | 1/2002 |
| JP | 2009290960 A | 12/2009 |
| JP | 2014036495 A | 2/2014 |
| WO | 2010055542 A2 | 5/2010 |
| WO | 2012025137 A1 | 3/2012 |
| WO | 2014110226 A1 | 7/2014 |

OTHER PUBLICATIONS

Sep. 4, 2019—first Office Action in corresponding application CN 201780023209.1.
Jul. 29, 2016—GB Search Report—GB1603373.0.
Dec. 17, 2019—Examination Report (GB1603373.0).

* cited by examiner

APPARATUS AND METHOD FOR GENERATING ELECTRICAL ENERGY

This application is a U.S. National Stage application under 35 U.S.C. § 371 of International Application PCT/GB2017/050342, filed Feb. 10, 2017, which claims priority to United Kingdom Application No. 1603373.0 filed Feb. 26, 2016, and European Application No. 16305165.9, filed Feb. 12, 2016. These applications, in their entirety, are incorporated by reference herein.

TECHNICAL FIELD

The present invention relates to an apparatus and method for generating electrical energy, and in particular to an apparatus and method for generating electrical energy from thermal fluctuations.

BACKGROUND

In consumer electronics there is a need to achieve miniaturisation and circuit integration of electronic devices with increased computing power, autonomous operation and reduced weight and volume to meet mobility requirements. These factors ultimately lead to thermally concentrated areas with an increasing demand for cooling. The use of water cooling pumps or blower fans is undesirable in many applications, for example because of safety or noise concerns.

The growing need for more effective heat transfer equipment has led to the development of high performance oscillating heat pipes (OHPs), also termed pulsating heat pipes (PHPs), for thermal management and low gradient heat transfer. These devices have a high effective thermal conductivity and can be fabricated in almost any shape and size. These OHPs can therefore be used to actively transport heat from one place to another, for example from a heat source (e.g. a microprocessor that requires cooling) to a heat sink.

Potential markets for OHPs therefore range from thermal management of microprocessors, which require structurally small heat transfer devices to transport heat from voltage transformers and current rectifiers (since most of the modern electronics require a direct current, DC), to a wide range of mobile computing devices.

SUMMARY

According to a first aspect of the present invention there is provided an apparatus for generating electrical energy. The apparatus comprises an oscillating heat pipe for transferring heat between a heat source and a heat sink. The apparatus comprises a pyroelectric generator for generating electricity from thermal fluctuations generated by the oscillating heat pipe as the oscillating heat pipe transfers heat between the heat source and the heat sink.

According to another aspect of the present invention there is provided a method for generating electrical energy. The method comprises transferring heat between a heat source and a heat sink using an oscillating heat pipe, and generating electricity using a pyroelectric generator from thermal fluctuations generated by the oscillating heat pipe as the oscillating heat pipe transfers heat between the heat source and the heat sink.

BRIEF DESCRIPTION OF THE DRAWINGS

For a better understanding of examples of the present invention, and to show more clearly how the examples may be carried into effect, reference will now be made, by way of example only, to the following drawings in which.

DETAILED DESCRIPTION

The embodiments of the present invention, as described herein, provide a pyroelectric oscillating heat pipe (POHP) apparatus for generating electrical energy, by actively converting heat into electricity while effectively transporting heat from one place to another. The embodiments of the present invention combine an OHP for high performance thermal management and low gradient heat transfer with a pyroelectric element so that the dissipated heat is removed for cooling, while the naturally high temperature fluctuations in the OHP device are transformed into electricity without mechanical motion, generating electricity locally from the otherwise wasted heat.

As mentioned earlier, it is noted that any references herein to an oscillating heat pipe (OHP) are intended to embrace a pulsating heat pipe (PHP).

Figure 1:
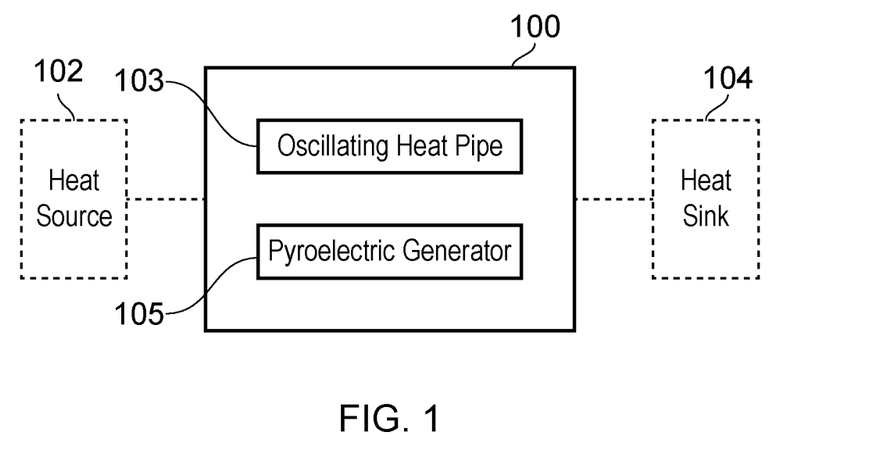
FIG. 1 shows an example of an apparatus according to an embodiment.

Referring to FIG. 1, according to a first embodiment there is provided an apparatus 100 for generating electrical energy. The apparatus 100 comprises an oscillating heat pipe 103 for transferring heat between a heat source 102 and a heat sink 104. The apparatus 100 comprises a pyroelectric generator 105 for generating electricity from thermal fluctuations generated by the oscillating heat pipe (103) as the oscillating heat pipe transfers heat between the heat source and the heat sink.

Figure 2:
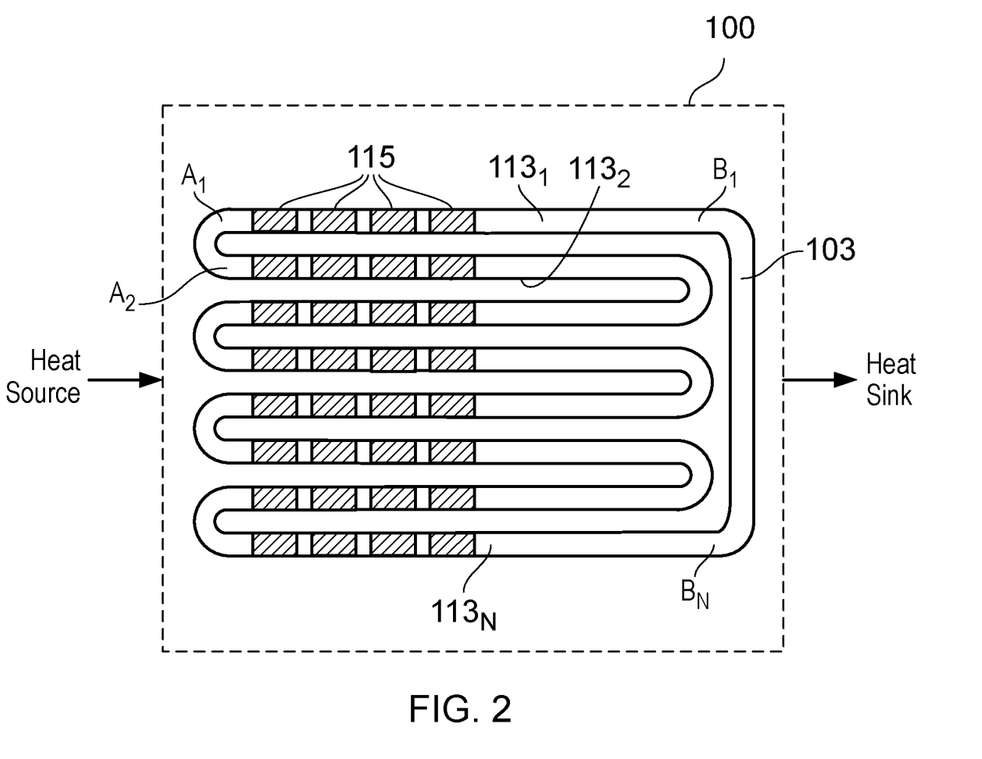
FIG. 2 shows an example of an oscillating heat pipe according to an embodiment.

Referring to FIG. 2, according to one embodiment the oscillating heat pipe 103 comprises a plurality of channel sections 113 (e.g. $113_1$ to $113_N$) arranged between the heat source and the heat sink. For example, the plurality of channel sections may be arranged between a heat source and a heat sink such that the plurality of channel sections are substantially in parallel to one another in a generally orthogonal direction between the heat source and the heat sink, as shown in FIG. 2, and interconnected to form a common fluid carrying channel (fluid not shown). In some examples the channel sections 113 comprise conduits having a circular cross section, although it is noted that other shaped channel sections may also be used.

In the example of FIG. 2 the plurality of channel sections 113 are arranged in a common plane, and wherein each outer channel section in the plane (e.g. $113_1$) has a first end (e.g. $A_1$) connected to a respective first end (e.g. $A_2$) of its neighbouring channel section (e.g. $113_2$), and a second end (e.g. $B_1$) connected to a respective second end (e.g. $B_N$) of the other outer channel section (e.g. $B_N$), i.e. the second end $B_1$ of outer channel section $113_1$ is connected to the second end $B_N$ of outer channel section $113_N$. As can be seen, according to this embodiment each inner channel section 113 in the plane (e.g. channel section $113_2$) has a first end connected to a respective first end of a neighbouring channel section in a first orthogonal direction (i.e. orthogonal to the length of a channel section), and a second end connected to a respective second end of a neighbouring channel section in a second orthogonal direction.

Figure 4:
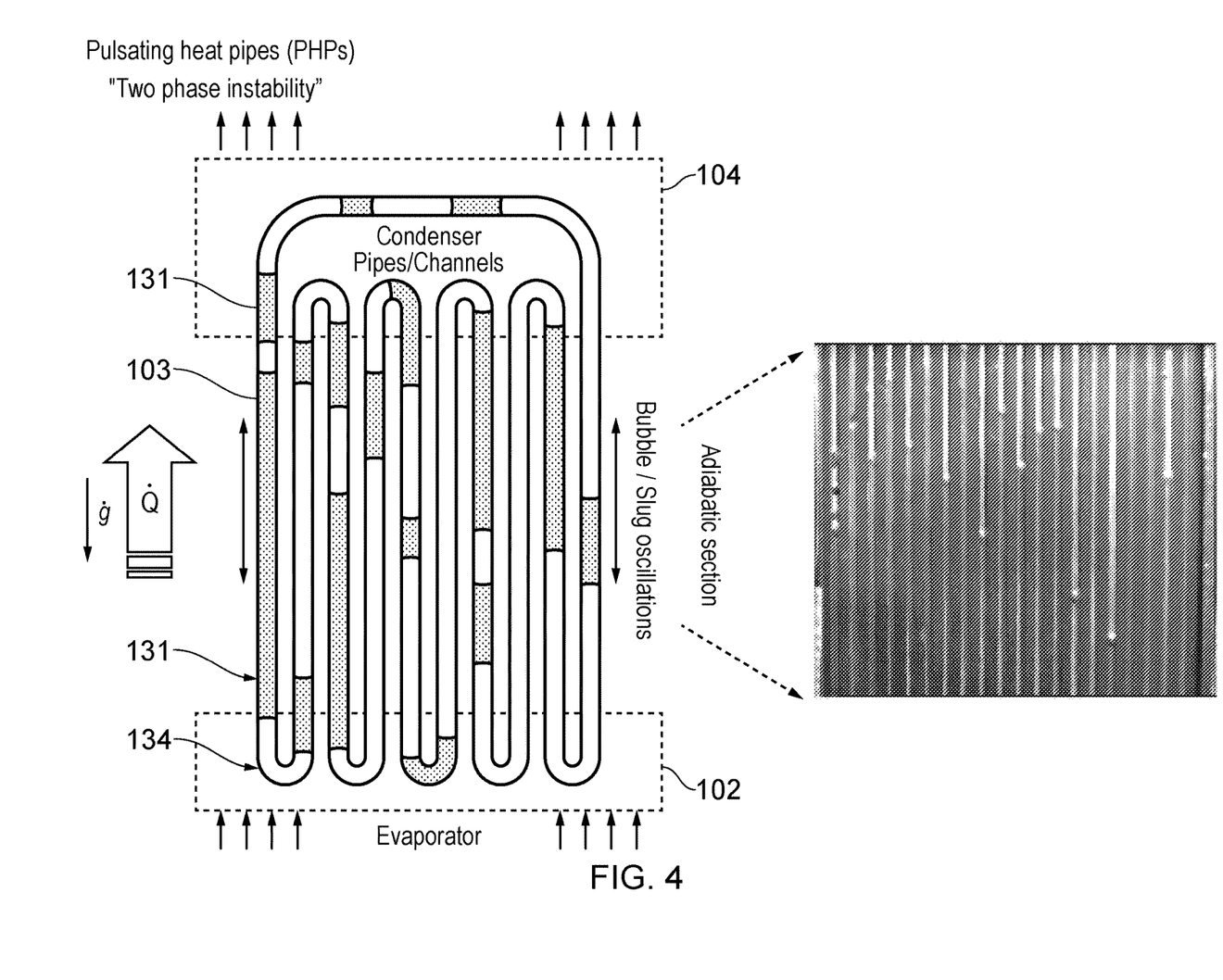
FIG. 4 shows an example of an oscillating heat pipe according to an embodiment.

It is noted that although the terms "first end" and "second end" are used in the context above to help define the structure of the apparatus, in practice a conduit start point and end point is defined by the fluid flow direction. Therefore, since the fluid flow is circular (due to the channel sections being connected to form a single conduit), such that only every second pipe has the same flow direction (as seen in FIG. 4 described later), the end of one channel section could also be considered to be connected to the new start of the next channel section.

It is noted that although the embodiments described herein illustrate an apparatus in which the channel sections are substantially straight and arranged substantially parallel to one another, it is noted that the channel sections may be arranged in other configurations, or have different shaped lengths, provided such channel sections span between a heat source and a heat sink. It is also noted that although the embodiments described herein comprise a plurality of channel sections interconnected to form a single conduit, the apparatus may comprise separate conduits forming a particular apparatus, wherein each conduit comprising a plurality of channel sections.

In the example of FIG. 2 the first ends (A) of the channel sections 113 are located towards a heat source side of the oscillating heat pipe, while the second ends (B) are located towards a heat sink side of the oscillating heat pipe.

As will be described in further detail later in the application, the oscillating heat pipe comprises a plurality of fluid portions (or slugs) which, during use, move within the channel sections 113 of the oscillating heat pipe while transferring heat from the heat source to the heat sink.

The pyroelectric generator is configured to generate electricity from temperature fluctuations generated by the fluid portions (or slugs) as they move within the channel sections of the oscillating heat pipe, passing the pyroelectric generator.

It is noted that the orientation of the plane in which the channel sections 113 lie can affect the operating mode of the apparatus during use, as will be illustrated later in FIGS. 5 to 11. As such, during use, the configuration of the orientation of the plurality of channel sections 113 can be used to control the operating mode of the apparatus, for example depending on how the orientation of the apparatus is configured in relation to gravity. Such configurations can be used, for example, to control between a steady state operating mode and a chaotic state operating mode (the latter providing greater temperature fluctuations).

In the example of FIG. 2 the pyroelectric generator comprises a plurality of pyroelectric elements 115. In this embodiment the pyroelectric generator comprises a plurality of pyroelectric elements 115 coupled to the plurality of channel sections 113 of the oscillating heat pipe.

For example, the plurality of pyroelectric elements 115 may be arranged along the lengths of the channel sections 113. In some embodiments the plurality of pyroelectric elements may be arranged towards a heat source side of the channel sections. Such an arrangement has the advantage of benefiting from greater temperature fluctuation as the fluid portions (or slugs) move within the channel sections due to the higher temperature gradient at the heat source. In some examples where the apparatus is configured to operate in a chaotic state mode of operation (corresponding to FIGS. 6 and 10 described later), each pyroelectric generator operates at its own frequency. In such an example the electrical energy generated by the respective pyroelectric generators can be rectified individually (i.e. in view of the pyroelectric generators operating at different frequencies due to the different temperature fluctuations). In a steady state mode of operation, (for example corresponding to FIGS. 5, 7, 8 and 9 described later) the pyroelectric generators may be electrically connected in series (e.g. to provide more voltage) or electrically connected in parallel (e.g. to provide more current) along the length of the channel sections, with the output of the combined series or combined parallel connected pyroelectric elements being rectified. It is noted, however, that the pyroelectric elements may also be rectified individually if desired, even in the steady mode of operation. It is also noted that in some examples a first plurality of pyroelectric elements may be coupled in series and a second plurality of pyroelectric elements coupled in parallel.

A channel section 113 may comprise one or more pyroelectric elements 115. Different channel sections 113 may contain a different number of pyroelectric elements 115. It is also noted that one or more channel sections may contain no pyroelectric elements 115.

According to some embodiments, the plurality of channel sections are configured as grooves in a layer of the oscillating heat pipe, with the pyroelectric elements being arranged, for example, in the grooves. Such an arrangement has an advantage of increasing the surface contact area, to provide a greater heat transfer between the oscillating heat pipe and the pyroelectric elements. The plurality of channel sections may be designed individually, if desired, for example to take into consideration laminar and turbulent flow characteristics.

In some examples the pyroelectric elements are coupled to the channel sections of the oscillating heat pipe using a heat conducting material, for example a heat conducting paste. This has an advantage of providing a greater heat transfer between the oscillating heat pipe wall and the pyroelectric element surface.

Figure 3A:
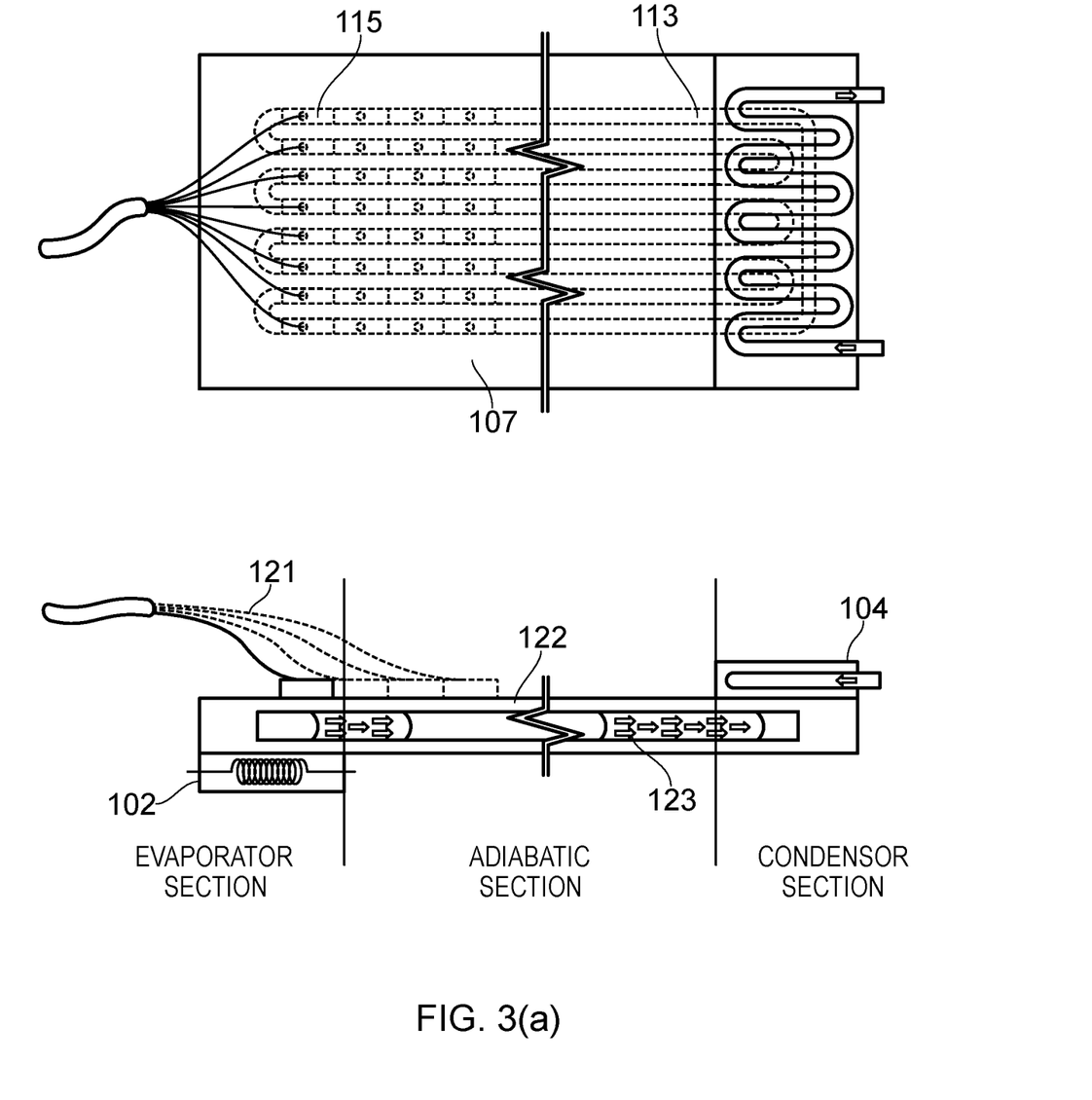
FIGS. 3a and 3b show an example of an apparatus according to another embodiment.

FIG. 3(a) shows an example of a pyroelectric oscillating heat pipe according to an embodiment (in a test set-up), including a plan view and a cross-sectional side view. Referring to the plan view, the dotted lines represent the channel sections 113 of the oscillating heat pipe, for example as described above in FIG. 2. The pyroelectric elements 115 are shown coupled to the channel sections of the oscillating heat pipe. Reference 107 illustrates an Adiabatic zone. It is noted that from a heat transfer perspective, heat is supplied at a heat source 102 and ejected at a heat sink 104. In an ideal system the area between the heat sink 104 and heat source 102 does not experience any heat transfer and is therefore considered adiabatic (no exchange of heat). However, since the pressure along the channel section changes and the entire device experiences a temperature gradient between the heat source 102 and the heat sink 104, the rapid change of the fluid from liquid to gaseous or vice versa induces a heat exchange followed by a change in temperature at the channel wall (where the pyroelectric elements are placed).

The cross sectional view shows the apparatus coupled to a heat source 102 (for example a condenser of an external process, or some other form of elevated temperature which forms a heat source, the heat source being attached to an evaporator section of the POHP system as shown in greater detail in FIG. 4 below), and coupled to a heat sink 104 (for example an external evaporator, or anything which is at a lower temperature than the heat source). In other words, the temperature of the heat source 102 is greater than the temperature of the heat sink 104.

In the example of FIG. 3*a*, the cross sectional side view also shows the pyroelectric element 115 being placed directly on top of a plate (or lid or upper portion 107 in FIG. 3(*b*) below). The pyroelectric element 115 is separated from the fluid flow using a good thermal conductor (e.g. copper) in order to maintain the pressure and fluid flow in the channel section and remove heat from the passing fluid. The area between two channel sections does not have a homogeneous temperature distribution and is therefore less suitable for thermal energy extraction.

The embodiments described herein are intended to be used for transferring heat from any form of heat source 102 to any form of heat sink 104. For example, in some applications the heat source 102 may comprises a microprocessor or some other electronic component within an electronic device that needs to be cooled, while the heat sink 104 may comprise any form of device for dissipating heat, e.g. a metal structure having a finned area to dissipate heat. The cross-sectional view illustrates how electrical wires 121 may be coupled to the pyroelectric elements 115 (for example using electrodes, not shown), such that electrical energy generated from fluctuations in temperature caused by fluid portions 123 (or slugs) moving within the channel sections 113 can be harvested. Reference 122 illustrates the channel wall of a channel section. In some embodiments the thickness of the channel wall 122 is reduced in order to improve the detection of thermal fluctuations by the pyroelectric elements 115.

Figure 3B:
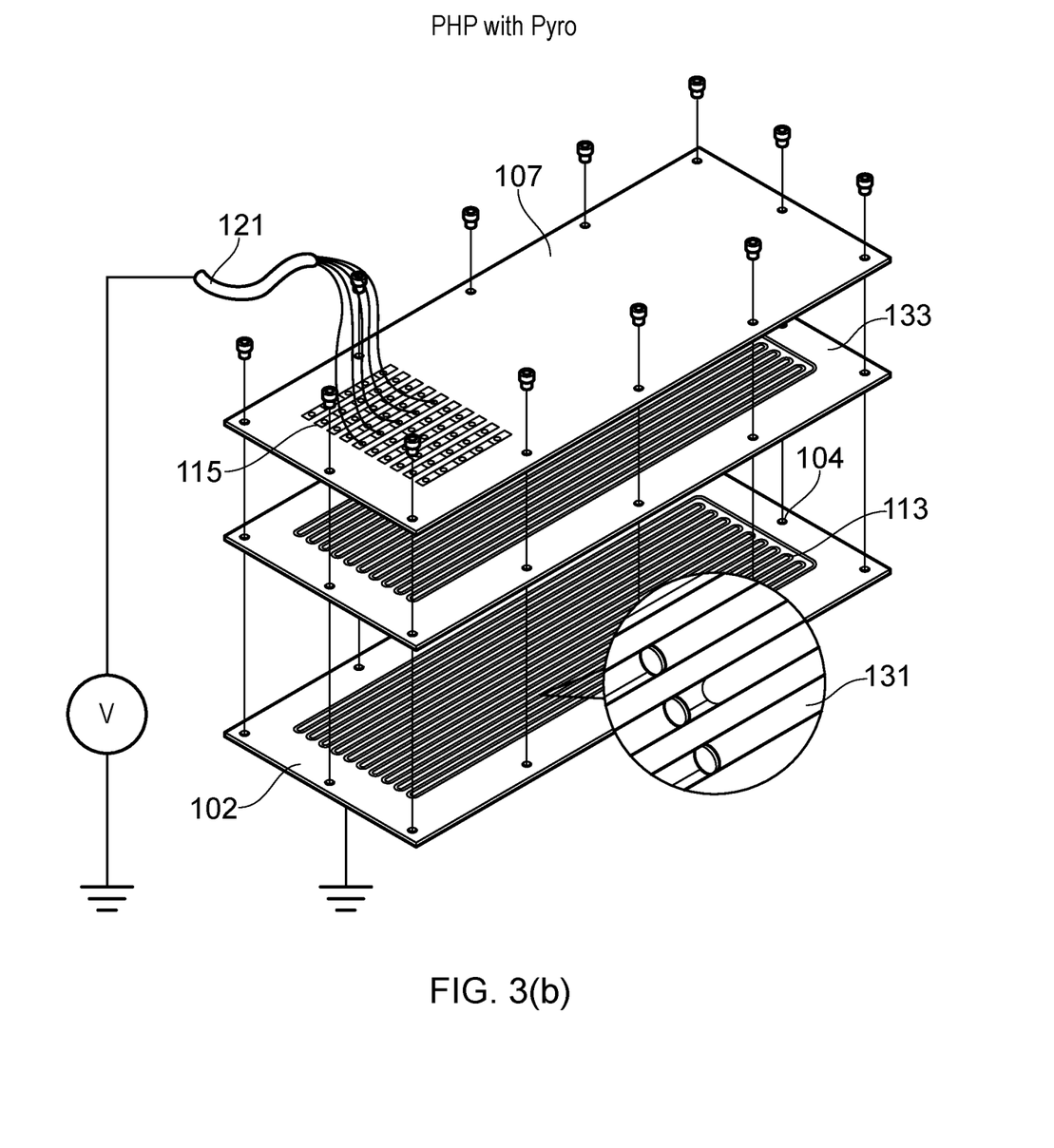

FIG. 3(*b*) illustrates an example of how an apparatus may be fabricating according to an example embodiment. In this example the pyroelectric elements 115 are formed in a first (top) layer, or lid 107. A second (bottom) layer comprises a plurality of channel sections (for example capillary channels), with the channel sections being arranged between a heat source region 102 and a heat sink region 104, for example substantially in parallel to one another, in a generally orthogonal direction between the heat source 102 and heat sink 104. The capillary channel sections 113 carrying fluid portions, for example liquid-vapour plugs and slugs as illustrated in the enlarged region 131. The channel sections 113 therefore carry portions of fluid interspaced with sections of gas. In this example a third (middle) layer comprises a sealing layer 133, for sealing the lid or top layer 107 and the body or bottom layer (where the channel sections are formed, e.g. machined into).

The embodiment of FIGS. 3(*a*) and 3(*b*) provides a flat plate closed loop Pyroelectric-Oscillating Heat Pipe (POHP) cooling and electrical energy harvesting set-up, where the pyroelectric elements are placed directly above the capillary channels of the OHP. The looped capillary channels successively feed a working fluid through the hot evaporator (left hot-side in FIGS. 3*a* and 3*b*) and the cold condenser zone (right cold-side in FIGS. 3*a* and 3*b*) which results in a rapidly pulsating fluid flow induced by the liquid-vapour transition, which in turn creates local pressure differences without mechanical motion. The change in thermodynamic state and resulting changes in the thermo-physical properties of the fluid are determined by the temperature, pressure, gravity and surface tension. The self-arranged fluid absorbs heat at the hot evaporator zone and ejects it at the cold condenser zone after passing through the adiabatic section of the channels, where the pyroelectric elements 115 are placed to generate electricity from the temperature changes.

If the device to be cooled acts as a heat source 102, the heat exchanged at the evaporator section evaporates the working fluid of the OHP and introduces vapour plugs and slugs which exchange heat along the channel wall of the oscillating heat pipe leading to fluctuations in temperature at a relatively high frequency, for example 0.45 Hz and magnitude 5 K, due to the phase transition. By attaching pyroelectric elements 115 to the walls of the channel sections 113, e.g. in the adiabatic section, as shown in the plan view of FIG. 3*a*, the system removes heat from the hot side and continuously converts the available temperature fluctuations into an electrical potential difference, at open circuit conditions, across the pyroelectric generator terminals.

FIG. 4 is provided to help illustrate the fluid portions further, and how they move within the oscillating heat pipe 103 in order to generate fluctuating temperatures which can be detected by the pyroelectric elements to generate electrical energy. The dark areas 131 represent fluid portions (e.g. liquid slugs) that move within the oscillating heat pipe 103, while the light regions 134 represent gaseous bubbles or gaps within the oscillating heat pipe 103.

When a temperature difference acts between a heat source side 102 and a heat sink side 104, a two phase instability arises which causes the liquid slugs to move or oscillate within the oscillating heat pipe, thus transferring thermal energy between the heat source side 102 and the heat sink side 104. It is movement of these fluid portions 131 (or liquid slugs) that exchange heat along the wall which causes the pyroelectric elements of the present invention to generate electrical energy.

The self-arranged fluid in the capillary channels of the oscillating heat pipe absorbs heat at the evaporator zone 102 and ejects it at the condenser zone 104 after passing through the adiabatic channels. Under elevated heat source conditions, the spatial temperature gradient introduces the liquid-vapour plugs and slugs which exchange heat along the channel wall of the looped oscillating heat pipe with local fluctuations in temperature. Thus, when a pyroelectric element is attached to the channel wall, for example of the adiabatic section, the pyroelectric element has the capability to directly convert the available temperature fluctuations into an electrical potential difference, at open circuit conditions, across the terminals of the pyroelectric generator. When the self-arranged fluid flow consecutively heats and cools the attached pyroelectric element, the transformed thermal energy can be used for electric storage and discharge purposes.

The pyroelectric generators of the present embodiments are thus driven by a self-induced temperature oscillator.

It is noted that various fluids may be used as the working fluid for the fluid portions (or slugs) of the oscillating heat pipe, including for example ethanol, Pentane or R134a. For the pyroelectric element, various polar dielectric materials such as industrial lead zirconate titanate (PZT) or lead magnesium niobate-lead titanate (PMN-PT) can be used.

In some embodiments the oscillating heat pipe and pyroelectric generator are formed as a solid state or monolithic device. For example, the solid state or monolithic device may comprise the oscillating heat pipe in a first layer and the pyroelectric generator (pyroelectric active materials) in a second layer.

According to some embodiments at least one channel section comprises a valve configured to control the fluid flow (e.g. speed and/or direction).

Experimental results have shown a linear relationship between the supplied heat energy, the change in temperature and the transformed electrical energy, based on preliminary electrical measurements on an operating OHP utilising an industrial lead zirconate titanate (PZT) which demonstrated an open circuit voltage of 0.4 [V] (AC), and with lead magnesium niobate-lead titanate (PMN-PT) which demonstrated an open circuit voltage of 0.8 [V] (AC) at a frequency of 0.45 [Hz] with an energy density of 53 [pJ cm-3] for PMN-PT.

Experimental results show a constant temperature oscillation at 0.45 Hz and greater than 0.3 K, and random temperature oscillations from 1 mHz to 100 Hz and from 0.01 K to 8 K.

One or more additional features can be provided for increasing constant and random oscillation, for example providing grooves for the pyroelectric elements as described earlier, e.g. right above the channel sections, or a micro-patterned electrode for enhanced heat transfer, or a thinner wall thickness for larger and faster heat diffusion, or selecting a particular working fluid for a particular application or heat profile. Device orientation can also be used to determine the fluid mode of operation, for example between a steady state mode of operation (e.g. FIG. 5 below) and a chaotic state mode of operation (e.g. FIG. 6 below).

According to some examples, by carefully choosing the fluids, e.g. organic working fluids used with the POHPs, the evaporation temperature of the system can be adjusted to the required temperature level, tailoring the cooling performance under different thermal boundary conditions. Potential applications beyond compact cooling are standalone small-scale generators operating steady state.

According to some embodiments, a maximisation of heat flow into the pyroelectric element is desirable for a POHP system, leading to higher energy transformation performance with faster temperature oscillations feeding the pyroelectric elements from low temperature sources. The conversion efficiency of the POHP in FIG. 3(b) is $\eta=1.34\times10^{-12}$, determined by the oscillation frequency (0.45 Hz) times the generated energy (0.3 nJ) per element over the heater power input (120 W). This is significantly lower than the theoretical Carnot efficiency of $\eta_{carnot}=9\times10^{-2}$ at 55° C., for which reason substantial space for optimisation of PHOP systems is possible.

Limitations in transformed energy can stem from the poor contact conduction when using structurally thick walls in an OHP, for example when using an OHP that has not been designed specifically with harvesting in mind, which can lead to a decrease and a delay in heat flow. As such, according to one embodiment, the thickness of the channels walls may be reduced to help the heat transfer.

In addition, more thermally conductive generator geometries with a larger area and patterned electrodes may be used to improve the thermal interface contact conduction, leading to a higher system efficiency. With 3D additive manufactured channels, the layout and the cooling power can be customised for each heating level enabling various areas of applications and opening a wide power window for POHP generators which is adjustable according to the available temperature level in conjunction with a flexible geometry.

Other parameters which may be adjusted and selected according to a particular application include the thermal interface of the pyroelectric elements with the OHP, surface area of the pyroelectric elements, filling level of the OHP, pressure within the OHP or the type of fluid used in the OHP, or the type of gaseous sections used in the OHP.

According to another aspect of the present invention, there is provided a method for generating electrical energy. The method comprises transferring heat between a heat source and a heat sink using an oscillating heat pipe, and generating electricity using a pyroelectric generator from thermal fluctuations generated by the oscillating heat pipe as the oscillating heat pipe transfers heat between the heat source and the heat sink.

The oscillating heat pipe may comprise a plurality of channel sections arranged between the heat source and the heat sink. For example, the method may comprise arranging the plurality of channel sections between a heat source and a heat sink, for example substantially in parallel to one another in a generally orthogonal direction between the heat source and the heat sink, and interconnecting the channels to form a common fluid carrying channel. It is noted that other arrangements may be used, whereby the channel sections are coupled between the heat source and heat sink in some other way.

In one example of the method, the plurality of channel sections are arranged in a common plane, and wherein each outer channel section in the plane (e.g. $113_1$) has a first end (e.g. $A_1$) connected to a respective first end (e.g. $A_2$) of its neighbouring channel section (e.g. $113_2$), and a second end (e.g. $B_1$) connected to a respective second end (e.g. $B_N$) of the other outer channel section (e.g. $B_N$), and wherein each inner channel section (e.g. channel section $113_2$) in the plane has a first end connected to a respective first end of a neighbouring channel section in a first orthogonal direction (i.e. orthogonal to the length of a channel section) and a second end connected to a respective second end of a neighbouring channel section in a second orthogonal direction.

The method may comprise locating the first ends on a heat source side of the oscillating heat pipe, and locating the second ends on a heat sink side of the oscillating heat pipe.

The oscillating heat pipe comprises a plurality of fluid portions which, during use, move within the channels of the oscillating heat pipe while transferring heat from the heat source to the heat sink.

The method comprises generating electrical energy using the pyroelectric generator, from temperature fluctuations generated by the fluid portions as they move within the channel sections of the oscillating heat pipe.

The pyroelectric generator may comprise a plurality of pyroelectric elements. For example, the pyroelectric generator may comprise a plurality of pyroelectric elements, and wherein the plurality of pyroelectric elements are coupled to the plurality of channel sections of the oscillating heat pipe.

In one embodiment, the method comprises arranging a plurality of pyroelectric elements along the lengths of the channel sections. The method may comprise arranging a plurality of pyroelectric elements towards a heat source side of the channel sections.

In one example the method comprises configuring the plurality of channel sections as grooves in a layer of the oscillating heat pipe.

In some embodiments the method may comprise providing a valve in at least one channel section, to control the fluid flow (e.g. speed and/or direction).

FIGS. 5 to 11 show examples of experimental results of embodiments of the invention.

Figure 5:
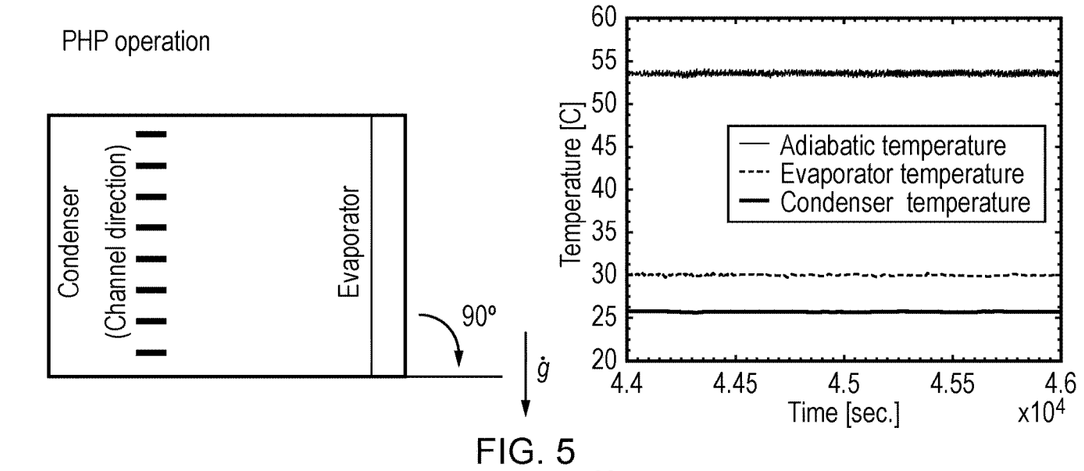
FIG. 5 shows an example of experimental results.
Figure 6:
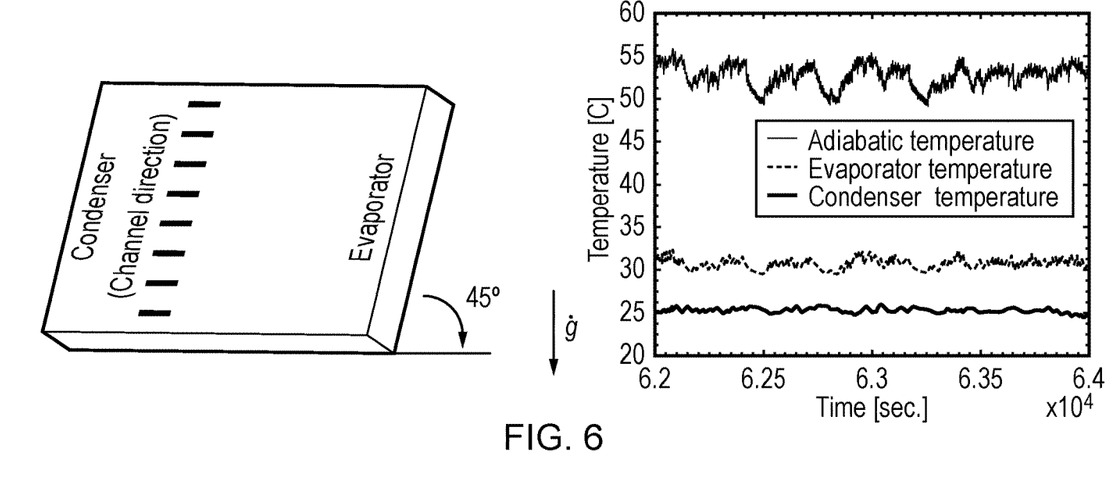
FIG. 6 shows an example of experimental results.

FIG. 5 shows the temperature in the adiabatic, evaporator and condenser regions with a POHP arranged in an upright configuration with respect to a gravitational direction, also referred to as being arranged at an angle of 90°, whereas FIG. 6 shows the temperature in the adiabatic, evaporator and condenser regions with a POHP arranged at an angle of 45° with respect to gravitational direction.

Figure 7:
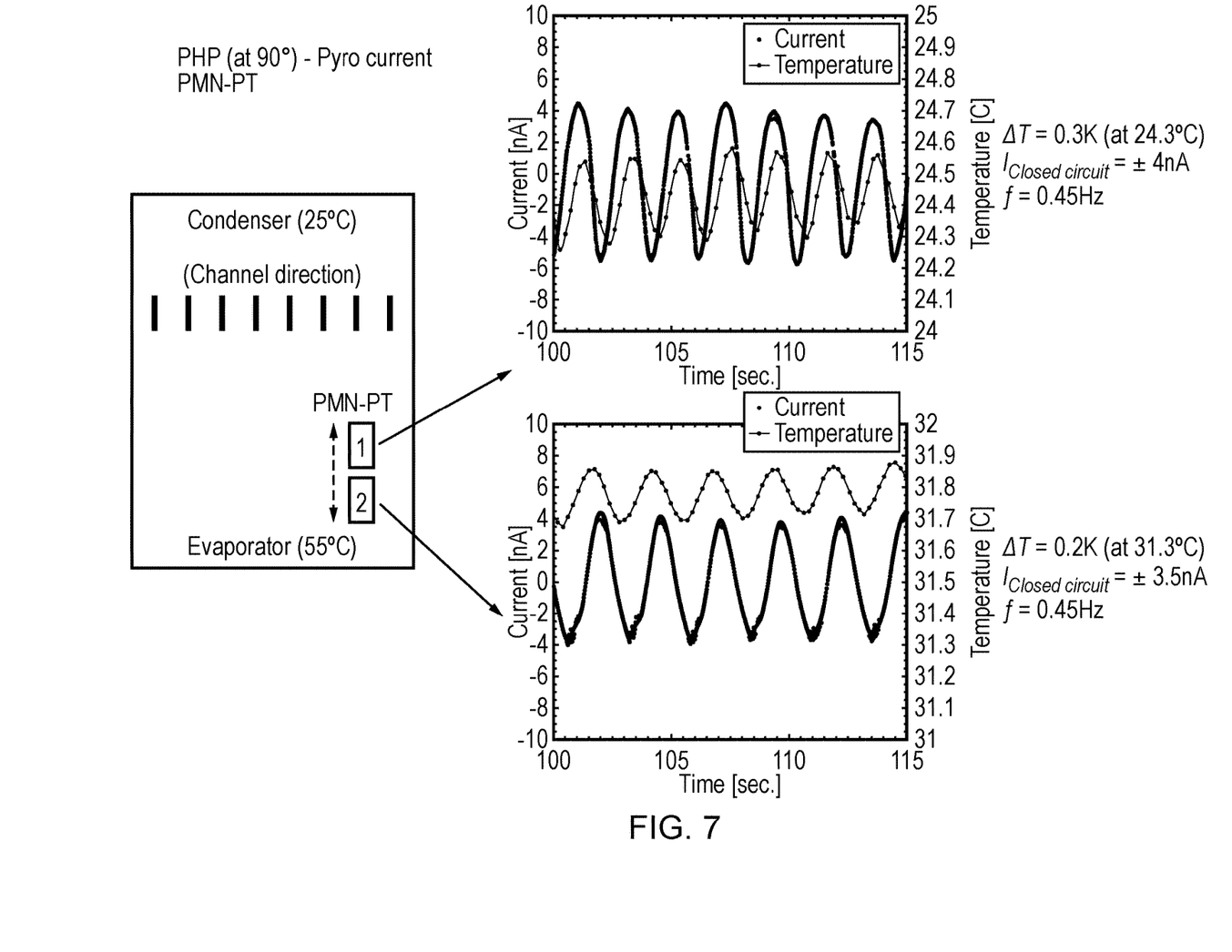
FIG. 7 shows an example of experimental results.

FIG. 7 shows an example of the current generated by a POHP coupled (at 90° orientation) between a heat source at 55° C. and a heat sink at 25° C., illustrating that a pyroelectric element closer to the heat source produces more current, i.e. because temperature oscillations closer to the heat source are higher—position 2 of FIG. 7 is therefore better.

Figure 8:
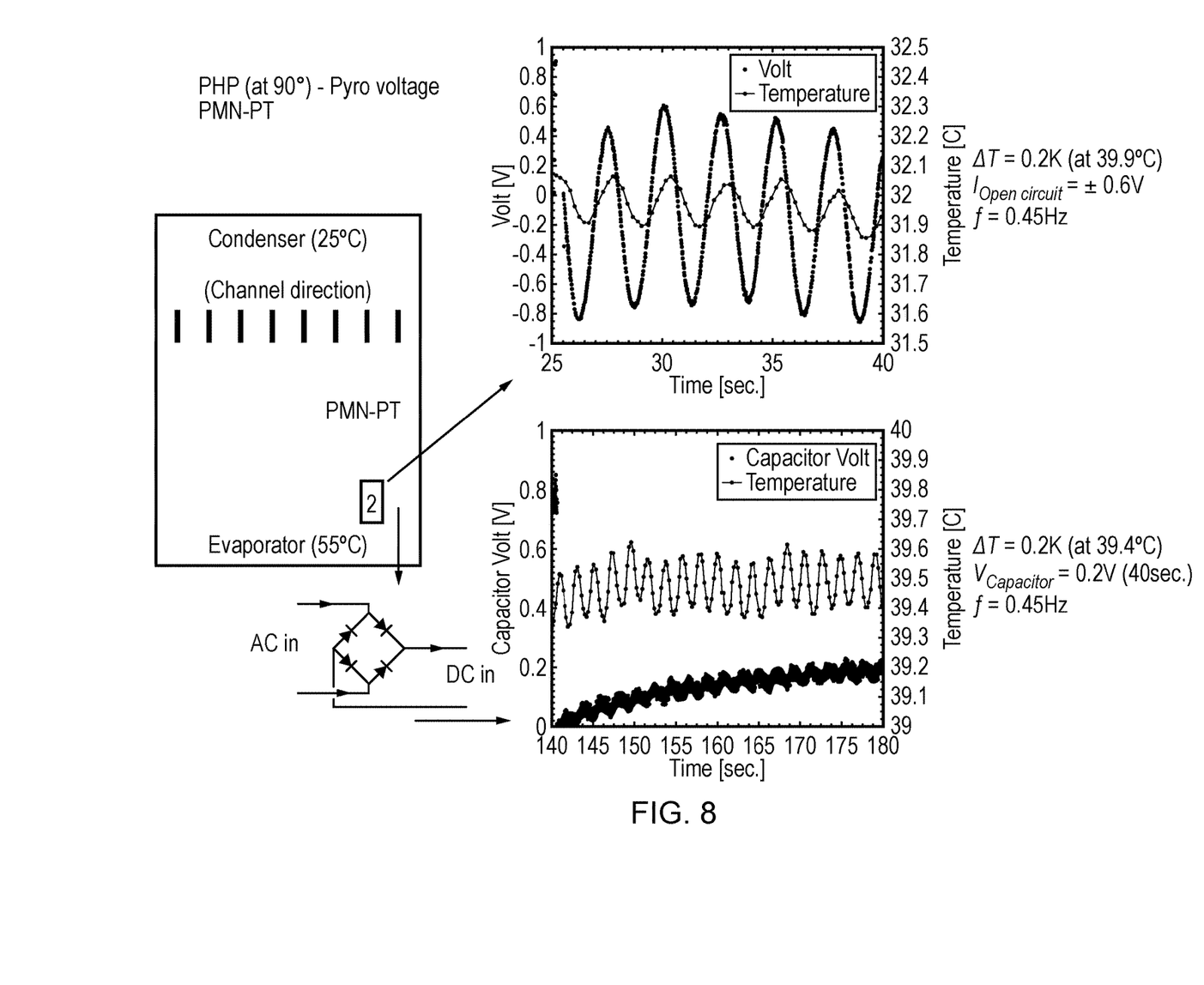
FIG. 8 shows an example of experimental results.

FIG. 8 shows another example of the current generated by a POHP coupled (at 90° orientation) between a heat source at 55° C. and a heat sink at 25° C. In position 2 of this example, the current is rectified using a full wave bridge rectifier and the generated electrical energy is stored, for example, in an external capacitor, where the external capacitor terminal voltage is measured.

Figure 9:
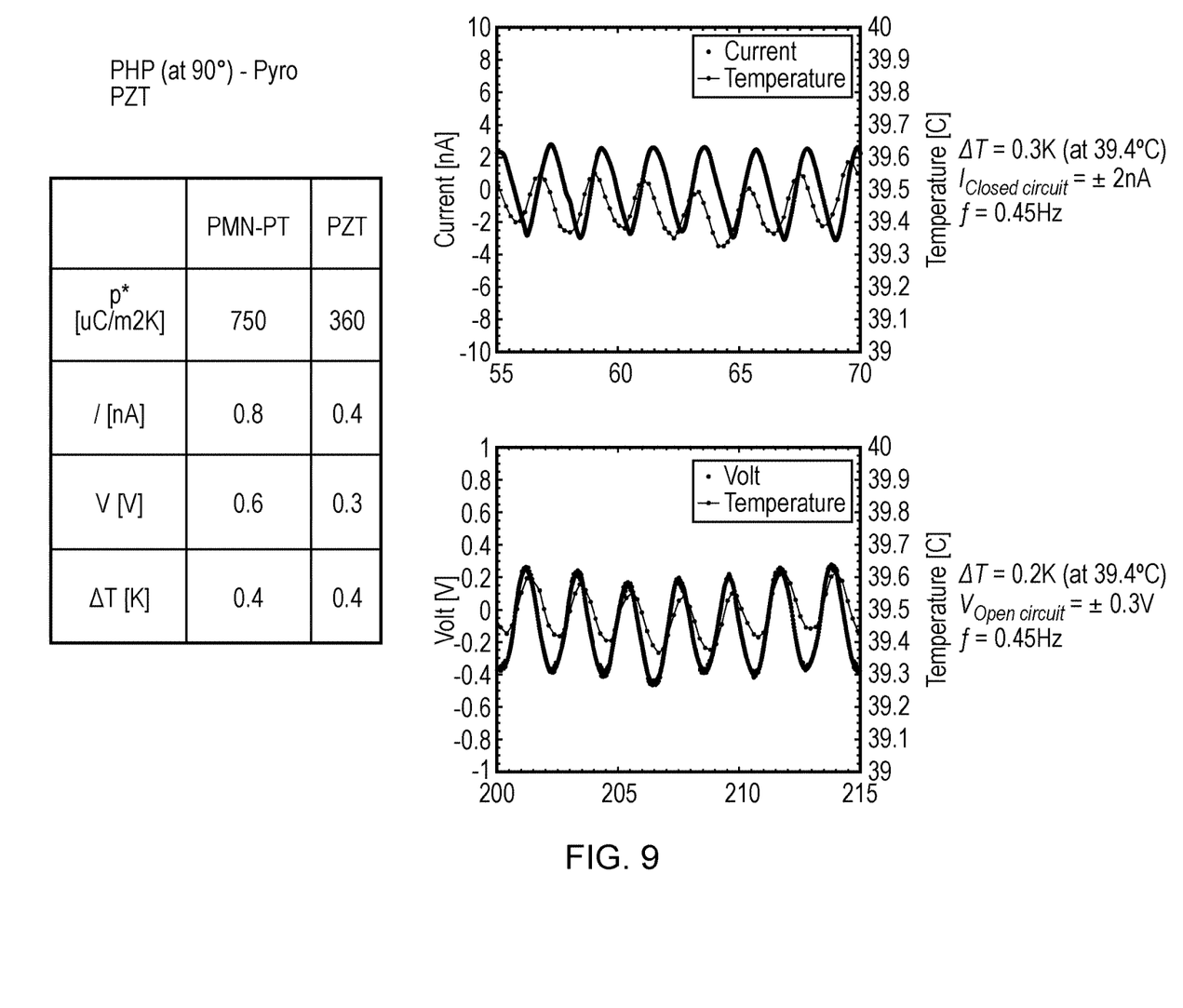
FIG. 9 shows an example of experimental results.

FIG. 9 shows another example of the current generated by a POHP coupled (at 90°) between a heat source at 55° C. and a heat sink at 25° C. This example provides a comparison between two materials. Material ONE is PMN-PT, which is used in FIGS. 7 and 8. Material TWO is PZT, which is used in FIG. 9. The table in FIG. 9 compares parameters for the two pyroelectric active materials used for system.

Figure 10:
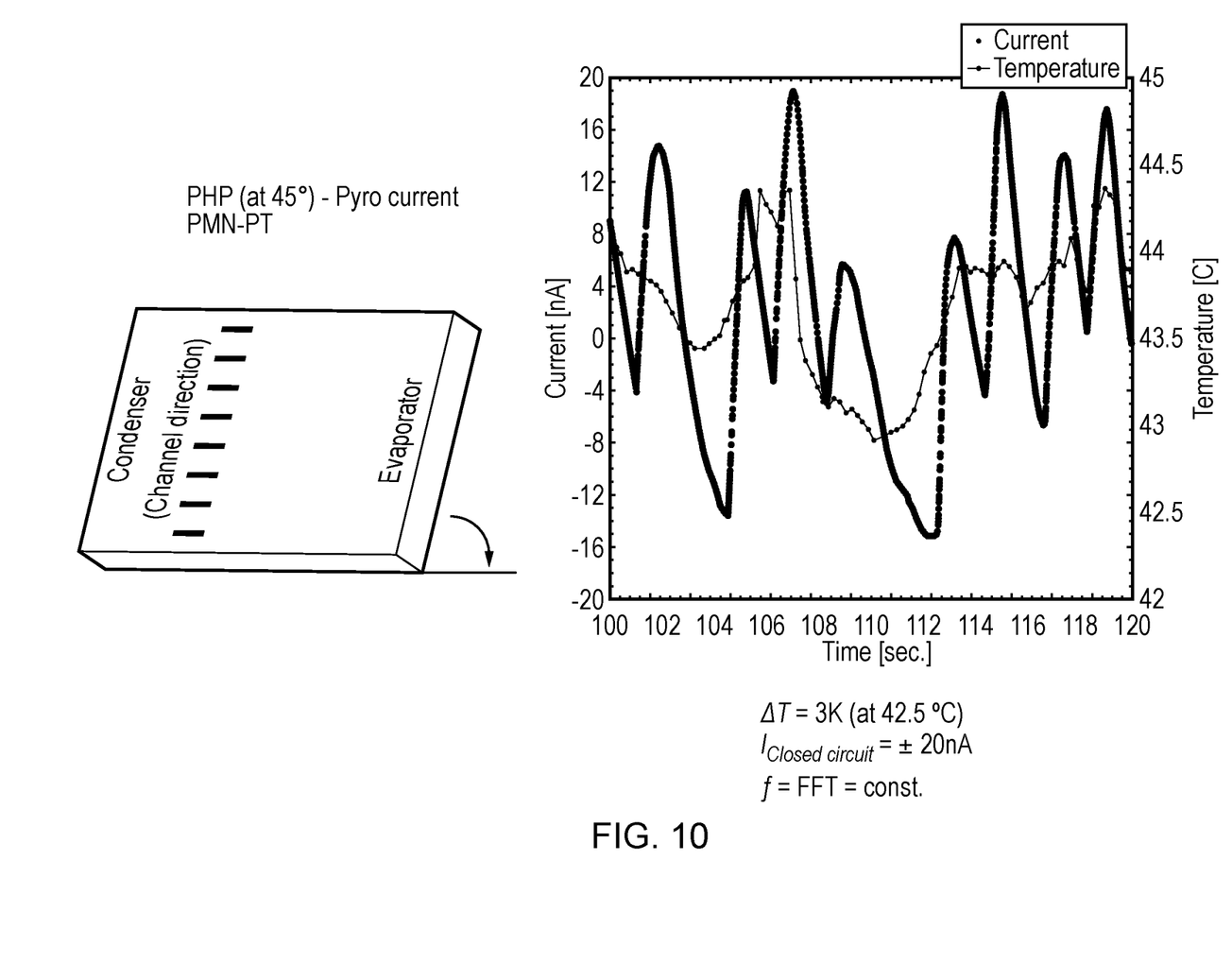
FIG. 10 shows an example of experimental results.
Figure 11:
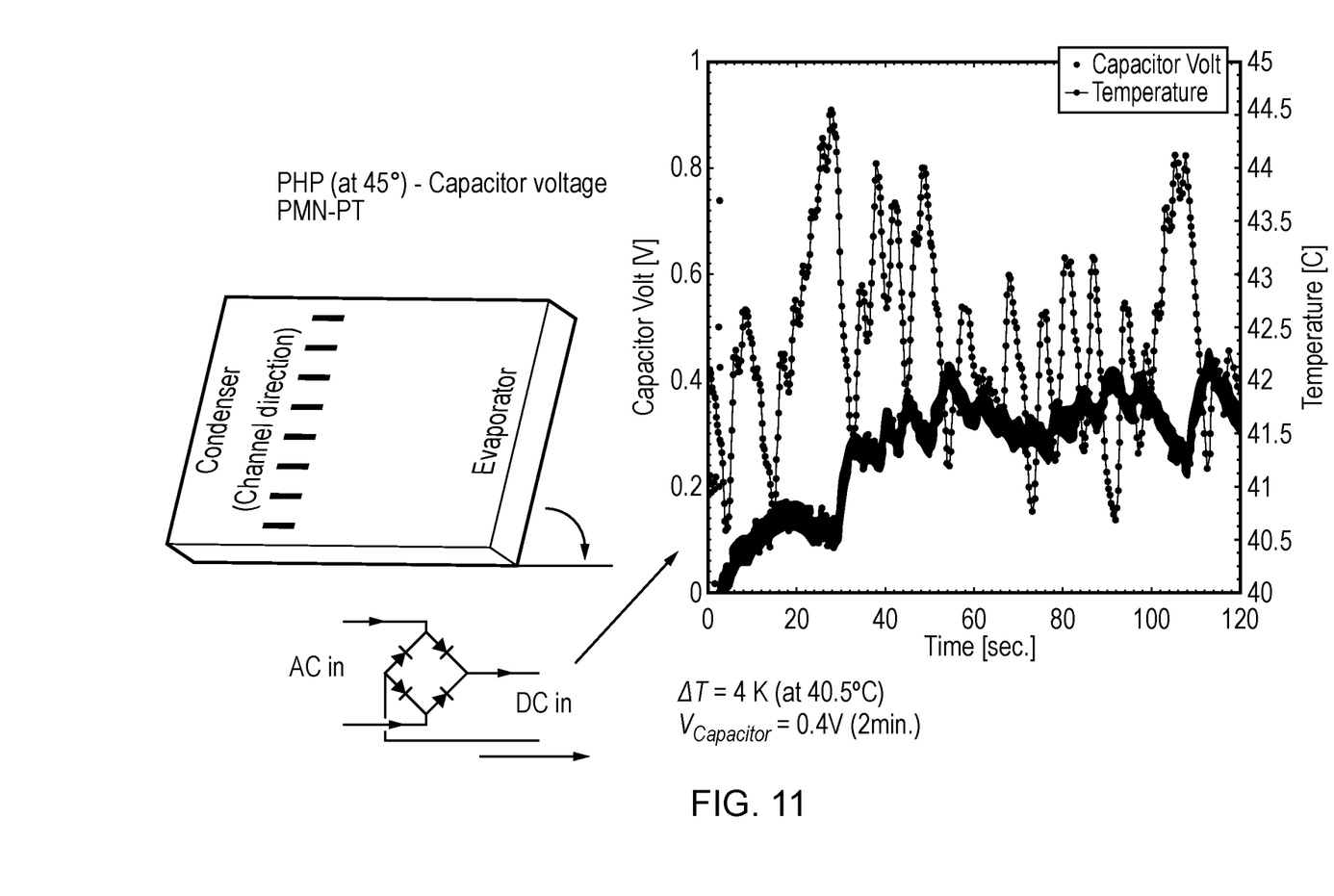
FIG. 11 shows an example of experimental results.

FIG. 10 shows another example of the current generated by a POHP coupled (at 45°) between a heat source at 55° C. and a heat sink at 25° C. According to FIG. 5 (steady state operation) and FIG. 6 (chaotic operation), two device orientations are compared. According to the chaotic operation of FIG. 6, FIG. 11 shows the corresponding voltage for the random temperature oscillations.

The embodiments described herein provide a viable pyroelectric harvesting and waste heat recovery system, by identifying an application where the heat flow and temperature changes are sufficiently rapid to generate useful power, in contrast to naturally occurring temperature fluctuations which are often slow.

In some embodiments the proposed combination of a pyroelectric-oscillating heat pipe (POHP) may be provided as a sealed and self-contained compact cooling and waste heat recovery generator device that improves the thermal management of the primary thermal driver and also provides an opportunity for harvesting additional and free electrical energy, where needed.

Due to the nature of the fluid flow, this can provide a solid-state, "fit and forget" design with no moving mechanical parts and no need for maintenance when transforming abundantly available low grade heat into power and acting as a standalone power supply.

The POHPs described in the embodiments herein can be of special interest for low temperature thermal to electrical energy transformation and for thermal management and low gradient heat transfer, since they have a high effective thermal conductivity due to the low temperature liquid-vapour transition, and can be fabricated in almost any shape. The self-controlled system actively removes heat and is passively controlled by capillary forces. Compared to conventional thermal energy generators, the POHP systems described herein can act as solid-state generators and thermal harvesters, operating a low-carbon micro-grids where the risk of mechanical wear and failure is reduced or eliminated.

Following the new route of miniaturisation, weight reductions and downscaling issues with micro fluid systems and with micro thermal technologies, the use of capillary forces and unexplored form factors lead to outperforming thermal resistance and system dynamics of micro scaled systems. Further, the performance enhancement provided by the embodiments described herein is expected to be 100 times better than conventional cooling systems due to the change in surface tension and the possibility of a supercritical evaporation while effectively recovering low temperature heat.

The embodiments described herein may be used in the growing markets of thermal management and energy harvesting, where half of the primary consumed energy is wasted in the form of low temperature heat. This trend continues as the number of interconnected devices for monitoring, computation, communication and maintenance, known as "the internet of the things" is growing, and so is the number of unexplored heat sources, the demand for standalone power supplies and the need for compact cooling. One source of waste heat is the consumer and industrial computer industry, which is expected to grow over coming years, and is a market that requires thermal management to expel a large amount of unused heat.

This additional electrical energy provided by the POHP of the embodiments described herein may be used in battery-less electronic devices, or can be used to extend battery life in electronic devices comprising batteries, and can help reduce peak power demand since most heat is dissipated when electronic devices operate at full range.

Furthermore, the ubiquitous electrical noise levels associated with conventional forced convective blower fans and fluid pumps can be reduced to zero, together with parasitic electrical losses, using the self-arranged fluid flow in the POHP embodiments described herein.

The embodiment provide an industrial scaled integrated cooling and heat recovery unit utilising the abundantly available heat through an OHP in order to drive a pyroelectric generator and effectively cool heat-concentrated areas without mechanical motion, while also generating electricity locally from the otherwise wasted heat.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An apparatus for generating electrical energy, the apparatus comprising:
   an oscillating heat pipe for transferring heat from a heat source to a heat sink, wherein the oscillating heat pipe comprises:
      a plurality of channel sections arranged between the heat source and the heat sink, wherein the plurality of channel sections are interconnected to form a common fluid carrying channel, and wherein each outer channel section has a first end connected to a respective first end of its neighboring channel section, and a second end connected to a respective second end of the other outer channel section, and wherein each inner channel section has a first end connected to a respective first end of a neighboring channel section in a first orthogonal direction, and a second end connected to a respective second end of a neighboring channel section in a second orthogonal direction;
      wherein each first end is located towards a heat source side of the oscillating heat pipe, and where each second end is located towards a heat sink side of the oscillating heat pipe; and
      a plurality of fluid portions which, during use, move between the heat source and the heat sink within the plurality of channel sections of the oscillating heat pipe while transferring heat from the heat source to the heat sink; and a pyroelectric generator for generating electricity from thermal fluctuations generated by the oscillating heat pipe as the oscillating heat pipe transfers heat from the heat source to the heat sink.

2. An apparatus as claimed in claim 1, wherein the plurality of channel sections are arranged substantially in parallel to one another in a generally orthogonal direction between the heat source and the heat sink.

3. An apparatus as claimed in claim 2, wherein the plurality of channel sections are arranged in a common plane.

4. An apparatus as claimed in claim 1, wherein the pyroelectric generator is configured to generate electricity from temperature fluctuations generated by the fluid portions as they move within the plurality of channel sections of the oscillating heat pipe.

5. An apparatus as claimed in claim 1, wherein the pyroelectric generator comprises a plurality of pyroelectric elements.

6. An apparatus as claimed in claim 1, wherein the pyroelectric generator comprises a plurality of pyroelectric elements, and wherein the plurality of pyroelectric elements are coupled to the plurality of channel sections of the oscillating heat pipe.

7. An apparatus as claimed in claim 6, wherein the plurality of pyroelectric elements are arranged along respective lengths of the plurality of channel sections.

8. An apparatus as claimed in claim 6, wherein a plurality of pyroelectric elements are arranged towards a heat source side of the plurality of channel sections.

9. An apparatus as claimed in claim 6, wherein the plurality of channel sections are configured as grooves in a layer of the oscillating heat pipe.

10. An apparatus as claimed in claim 9, wherein the pyroelectric elements are arranged in the grooves.

11. An apparatus as claimed in claim 6 wherein the pyroelectric elements are coupled to the plurality of channel sections of the oscillating heat pipe using a heat conducting material.

12. An apparatus as claimed in claim 1, wherein the oscillating heat pipe and pyroelectric generator are formed as a solid state or monolithic device.

13. An apparatus as claimed in claim 12, wherein the solid state or monolithic device comprises the oscillating heat pipe in a first layer and the pyroelectric generator in a second layer.

14. An apparatus as claimed in claim 1, wherein at least one channel section of the plurality of channel sections comprises a valve configured to control one of a fluid flow, a speed of fluid flow, or a direction of fluid flow.

15. A method for generating electrical energy, the method comprising:

transferring heat from a heat source to a heat sink using an oscillating heat pipe, wherein the oscillating heat pipe comprises:

a plurality of channel sections arranged between the heat source and the heat sink such that the plurality of channel sections are interconnected to form a common fluid carrying channel, wherein each outer channel section has a first end connected to a respective first end of its neighboring channel section, and a second end connected to a respective second end of the other outer channel section, and wherein each inner channel section has a first end connected to a respective first end of a neighboring channel section in a first orthogonal direction and a second end connected to a respective second end of a neighboring channel section in a second orthogonal direction, and wherein each first end is located on a heat source side of the oscillating heat pipe, and each second end is located on a heat sink side of the oscillating heat pipe, and a plurality of fluid portions which, during use, move between the heat source and the heat sink within the plurality of channel sections of the oscillating heat pipe while transferring heat from the heat source to the heat sink; and generating electricity using a pyroelectric generator from thermal fluctuations generated by the oscillating heat pipe as the oscillating heat pipe transfers heat from the heat source to the heat sink.

16. A method as claimed in claim 15, comprising arranging the plurality of channel sections substantially in parallel to one another in a generally orthogonal direction between the heat source and the heat sink.

17. A method as claimed in claim 16, wherein the plurality of channel sections are arranged in a common plane.

18. A method as claimed in claim 15, comprising generating electrical energy using the pyroelectric generator, from temperature fluctuations generated by the fluid portions as they move within the plurality of channel sections of the oscillating heat pipe.

19. A method as claimed in claim 15, wherein the pyroelectric generator comprises a plurality of pyroelectric elements.

20. A method as claimed in claim 19, wherein the plurality of pyroelectric elements are coupled to the plurality of channel sections of the oscillating heat pipe.

21. A method as claimed in claim 20, comprising arranging the plurality of pyroelectric elements along respective lengths of the plurality of channel sections.

22. A method as claimed in claim 20, further comprising arranging the plurality of pyroelectric elements towards a heat source side of the plurality of channel sections.

23. A method as claimed in claim 15, wherein the plurality of channel sections are configured as grooves in a layer of the oscillating heat pipe.

24. A method as claimed in claim 15, further comprising controlling, via a valve in at least one channel section of the plurality of channel sections, a speed or direction of fluid flow.

* * * * *